(12) United States Patent
Pandey

(10) Patent No.: US 10,062,689 B2
(45) Date of Patent: Aug. 28, 2018

(54) METHOD TO FABRICATE VERTICAL FIN FIELD-EFFECT-TRANSISTORS

(71) Applicant: GLOBALFOUNDRIES, Inc., Grand Cayman (KY)

(72) Inventor: Shesh Mani Pandey, Saratoga Springs, NY (US)

(73) Assignee: Globalfoundries Inc., Grand Cayman (KY)

(*) Notice: Subject to any disclaimer, the term of this patent is extended or adjusted under 35 U.S.C. 154(b) by 0 days.

(21) Appl. No.: 15/154,087

(22) Filed: May 13, 2016

(65) Prior Publication Data

US 2017/0330878 A1 Nov. 16, 2017

(51) Int. Cl.
| | |
|---|---|
| H01L 29/66 | (2006.01) |
| H01L 27/088 | (2006.01) |
| H01L 29/51 | (2006.01) |
| H01L 29/78 | (2006.01) |
| H01L 29/08 | (2006.01) |
| H01L 21/8234 | (2006.01) |

(52) U.S. Cl.
CPC .. H01L 27/0886 (2013.01); H01L 21/823418 (2013.01); H01L 21/823431 (2013.01); H01L 21/823462 (2013.01); H01L 29/0847 (2013.01); H01L 29/517 (2013.01); H01L 29/518 (2013.01); H01L 29/7834 (2013.01)

(58) Field of Classification Search
CPC .................................................. H01L 21/845
See application file for complete search history.

(56) References Cited

U.S. PATENT DOCUMENTS

| | | | | |
|---|---|---|---|---|
| 9,318,322 | B2* | 4/2016 | Wu | H01L 21/02362 |
| 9,362,386 | B2* | 6/2016 | Huang | H01L 29/66977 |
| 9,362,405 | B1* | 6/2016 | Jacob | H01L 29/7851 |
| 2005/0250285 | A1* | 11/2005 | Yoon | H01L 21/84 438/283 |
| 2014/0203378 | A1* | 7/2014 | Ou | H01L 21/823431 257/401 |
| 2014/0264604 | A1* | 9/2014 | Tsai | H01L 29/785 257/347 |
| 2015/0035017 | A1* | 2/2015 | Wann | H01L 29/785 257/288 |
| 2015/0263122 | A1* | 9/2015 | Hsiao | H01L 29/515 257/401 |

(Continued)

*Primary Examiner* — Thao P Le

(57) ABSTRACT

A FinFET-type device is formed having a fin structure with vertically-oriented source/drain regions (with lightly doped extensions) and a channel region extending substantially perpendicular to the surface of the semiconductor substrate. A semiconductor stack is provided (or formed) having a first heavily doped layer and two lightly doped layer, with a channel region formed between the two lightly doped layers. The stack is etched to form fin structures (for the devices) and a gate stack is formed along the sidewalls of the channel region. A second heavily doped layer is selectively formed on the upper lightly doped layer. A portion of the first heavily doped layer and a portion of the lower lightly doped layer form a lower S/D region with a lightly doped extension region. Similarly, a portion of the second heavily doped layer and a portion of the upper lightly doped layer form an upper S/D region with a lightly doped extension region.

11 Claims, 8 Drawing Sheets

(56) References Cited

U.S. PATENT DOCUMENTS

2016/0203986 A1* 7/2016 Chou ............... H01L 29/517
                                                    438/591
2016/0260638 A1* 9/2016 Chou ............ H01L 21/823461
2016/0300931 A1* 10/2016 Fu ................ H01L 29/66795

* cited by examiner

METHOD TO FABRICATE VERTICAL FIN FIELD-EFFECT-TRANSISTORS

TECHNICAL FIELD

The present disclosure relates generally to the manufacture of semiconductor devices, and more particularly, to the fabrication and manufacture of a novel vertically oriented Fin field-effect transistor (FinFET) type structure.

BACKGROUND

Fin field-effect transistors (FinFETs) are multi-gate transistors where the conducting channel is wrapped around a thin piece of silicon, often referred to and configured as a "fin." The dimensions of the fin structure determine the effective channel width of the transistor. Typically, the source, drain and gate are formed extending above the substrate, and the FinFET is viewed as a MOSFET device with a folded gate feature. Vertically-oriented FinFETs (having channels substantially perpendicular to the wafer surface) have corresponding source and drain regions oriented vertically—and these are sometimes referred to as "nanowire" (NW) devices. These types of structures are promising candidates for small line width technology (e.g., 7 nanometer and smaller) because of their excellent short channel effect control, scalability and higher current drive per unit width. However, various challenges exist, such as control of the gate length, formation of the extension region, difficulty in maintaining symmetrical devices, and integration with existing process flows.

Accordingly, there is a need for new FinFET-type device and structure (and methods of manufacture/fabrication) that allows easy formation of extension regions, maintains symmetry in the devices and assists in control of the gate length.

SUMMARY

In accordance with one advantageous embodiment, there is provided a vertically-oriented field-effect transistor (FET) device including a bulk substrate, a first source/drain (S/D) region of a first conductivity type disposed above the bulk substrate, and a first lightly doped extension region of the first conductivity type disposed above the first S/D region. A fin channel region of semiconductor material is disposed above the first lightly doped extension region, and a second lightly doped extension region of the first conductivity type is disposed above the fin channel region. The device further includes a second source/drain (S/D) region of the first conductivity type disposed above the second lightly doped extension region, and a gate structure disposed along sidewalls of at least a portion of the fin channel region. The fin channel region is configured to implement a conductive channel between the first and second S/D regions, wherein the conductive channel extends substantially perpendicular to a surface of the bulk substrate.

In another embodiment, there is provided a method of manufacturing or fabricating a vertically-oriented field-effect transistor (FET) device. The method includes providing a semiconductor substrate stack having a bulk substrate, a lower source/drain (S/D) layer disposed above the bulk substrate and comprising a first concentration of dopants of a first conductivity type, a lower extension layer disposed above the lower S/D layer and comprising a second concentration of dopants of the first conductivity type, the second concentration of dopants less than the first concentration of dopants, a channel region layer comprising semiconductor material, and an upper extension layer disposed above the channel region layer and comprising a third concentration of dopants of the first conductivity type. A hard mask is formed above the semiconductor substrate stack exposing portions thereof, and the exposed portions are selectively removed to define a fin channel structure comprising at least portions of the upper extension layer, the channel region layer, and the lower extension layer, and to expose sidewalls of the channel region layer. A gate stack is formed on the exposed sidewalls of the channel region layer. The method further includes performing a planarizing and etching process to expose at least a portion of the upper extension layer, and forming an upper S/D layer on the exposed upper extension layer.

In yet another embodiment, there is provided a method of fabricating a semiconductor device structure. The method includes providing a semiconductor substrate stack having a lower source/drain (S/D) layer disposed above the bulk substrate and comprising dopants of a first conductivity type, a lower extension layer disposed above the lower S/D layer and comprising dopants of the first conductivity type, a channel region layer comprising semiconductor material, and an upper extension layer disposed above the channel region layer comprising dopants of the first conductivity type. A mask layer is formed above the semiconductor substrate stack, exposing portions thereof, and exposed portions are selectively removed to define a fin channel structure comprising at least portions of the upper extension layer, the channel region layer, and the lower extension layer, and to expose sidewalls of the channel region layer. A gate is foamed on the exposed sidewalls of the channel region layer, planarizing and etching is performed to expose at least a portion of the upper extension layer, and an upper S/D layer is formed on the exposed upper extension layer and comprises dopants of the first conductivity type.

The foregoing has outlined rather broadly the features and technical advantages of the present disclosure so that those skilled in the art may better understand the detailed description that follows. Additional features and advantages of the present disclosure will be described hereinafter that form the subject of the claims. Those skilled in the art should appreciate that they may readily use the concept and the specific embodiment(s) disclosed as a basis for modifying or designing other structures for carrying out the same or similar purposes of the present disclosure. Those skilled in the art should also realize that such equivalent constructions do not depart from the spirit and scope of the claimed invention in its broadest form.

Before undertaking the Detailed Description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
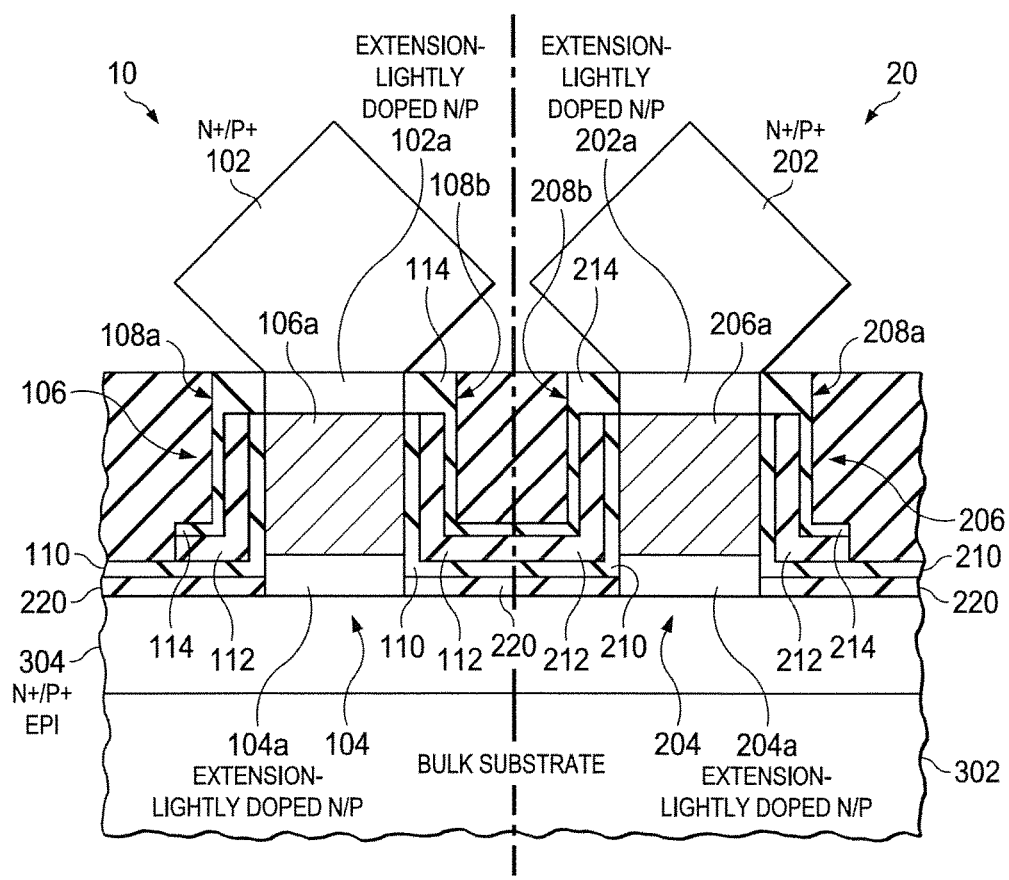
FIG. 1 illustrates a cross-sectional view of two FinFET-type semiconductor devices in accordance with the present disclosure.

The present disclosure describes a novel FinFET-type semiconductor device having vertically oriented source/drain regions (with a channel region substantial perpendicular to the substrate surface) and lightly doped extension regions proximate each of the source/drain regions, and a method of manufacturing such devices. A substrate stack structure is provided or formed having a highly doped layer, a first lightly doped layer, a channel region substrate layer and a second lightly doped layer, all disposed upon a bulk substrate. Fin structures are formed using a fin mask, a spacer or isolation layer is formed, and a gate stack layer is formed on the sidewalls of the fin structures. Selective etching removes portion(s) of the gate stack layer, planarization may occur, and the fin mask is removed and source/drain regions are formed proximate the second lightly doped layer and above the remaining fin structures—thereby forming the vertical FinFET-type devices.

FIGS. 1 through 9 and the various embodiments used to describe the principles of the present disclosure in this patent document are by way of illustration only and should not be construed in any way to limit its scope. Those skilled in the art will understand that the principles described herein may be implemented in any type of suitably arranged FET device.

To simplify the drawings, reference numerals from previous drawings will sometimes not be repeated for structures that have already been identified.

Turning to FIG. 1, there is illustrated a cross-sectional view of two novel FinFET-type (or NW) semiconductor devices 10, 20. Though two FETs are shown, the present disclosure applies to a single such device, as well as many such devices.

The device 10 includes a first source/drain (S/D) region 102, a second S/D region 104, a fin structure 106 having a channel region 106a, and a gate stack 108 (108a, 108b), all disposed on a substrate 302. The gate stack 108 includes a gate insulator 110, a work function conductive layer (WFM) 112, and a nitride layer 114. The fin structure 106 forms a channel region or portion. In one embodiment, the S/D regions 102, 104 include dopants (e.g., n-type or p-type) of a first conductivity type, and the channel region 106a includes dopants of a second conductivity type (or may include no dopants). The source/drain regions 102, 104 also include lightly doped extension regions 102a, 104a of the same conductivity type as the source/drain regions 102, 104.

Similarly, the device 20 includes a first source/drain (S/D) region 202, a second S/D region 204, a fin structure 206 having a channel regions 206a, and a gate stack 208 (208a, 208b), all disposed on the substrate 302. The gate stack 208 includes a gate insulator 210, a work function conductive layer (WFM) 212, and a nitride layer 214. The fin structure 206 forms a channel region or portion. In one embodiment, the S/D regions 202, 204 include dopants (e.g., n-type or p-type) of a first conductivity type, and the channel region 206 includes dopants of a second conductivity type (or may include no dopants). The source/drain regions 202, 204 also include lightly doped extension regions 202a, 204a of the same conductivity type as the source/drain regions 202, 204.

A bottom isolation (e.g., barrier or spacer) layer 220 is disposed between the layer that forms the S/D regions 104/204 and the gate stack 108/208. Any suitable insulative or buffer layer may be utilized.

As will be appreciated, in one embodiment, the gate stack 108 and gate stack 208 are formed at the same time and comprise essentially the same layers. Further, only the relevant portions of the FinFET-type devices 10, 20 are shown, and the source and drain contacts (and actual gate contacts) are not illustrated.

It will also be understood that, depending on the type of FET device desired, S/D regions 102, 104, 202, 204 will be doped with either n-type or p-type impurities, while the corresponding channel regions 106a, 206a will be doped with the opposite type—either p-type or n-type (or no type), respectively.

FIGS. 2 through 8 are diagrams that illustrate a series of relevant steps of one embodiment of a method or process for manufacturing the FinFET-type devices 10, 20 (shown in FIG. 1).

Figure 2:
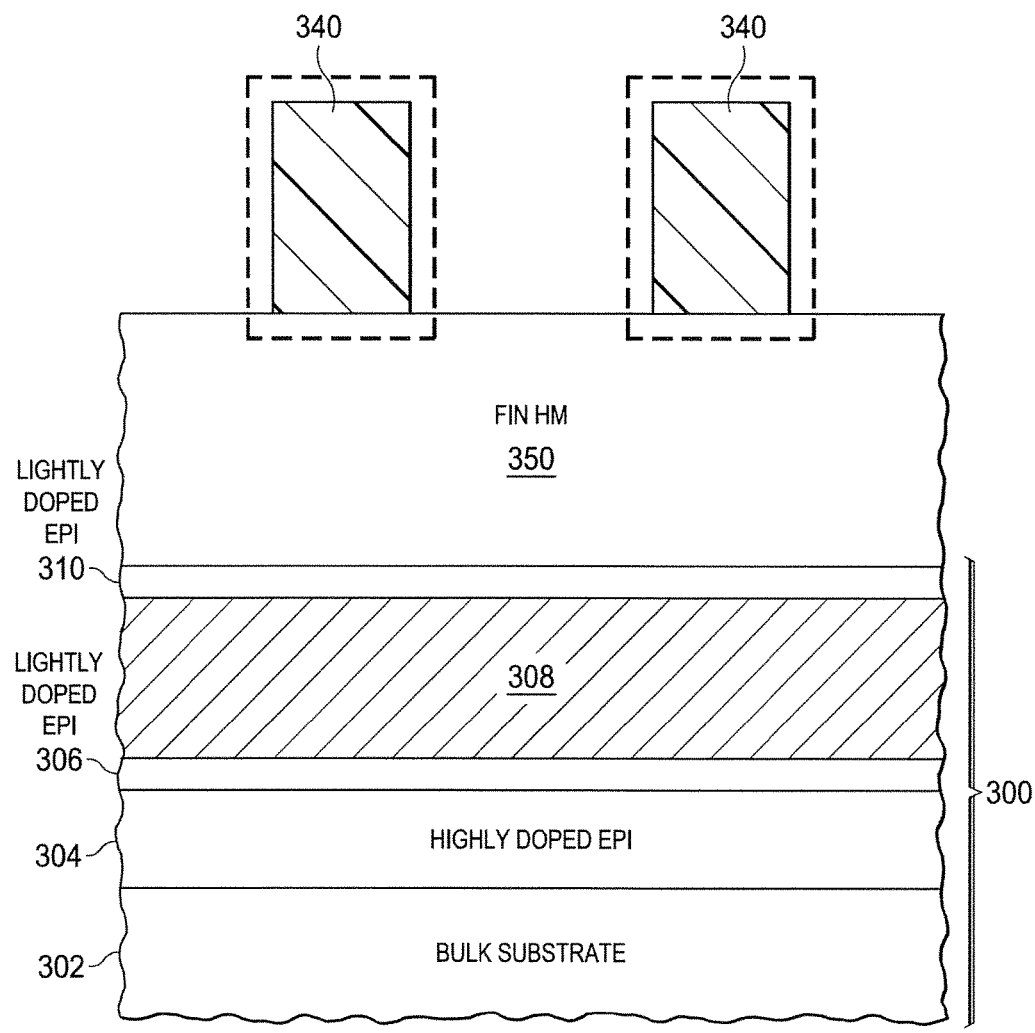
FIGS. 2-8 are diagrams that illustrate a series of steps of one embodiment of a method or process for manufacturing the FinFET-type devices shown in FIG. 1.

Now turning to FIG. 2, a semiconductor stack 300 is provided. As illustrated, the stack 300 includes a bulk substrate 302, a highly doped layer 304, a first lightly doped layer 306, a channel region layer 308, and a second lightly doped layer 310. As will be appreciated, the semiconductor stack 300 may be provided by a semiconductor wafer manufacturer (that readily supplies such wafers at the specifications of a customer) with all or some of these layers. In another embodiment, the present disclosure includes the formation of these various layers on the bulk substrate 302 resulting in the semiconductor stack 300.

The bulk substrate 302 may be any suitable bulk substrate material, such as bulk semiconductor material (e.g., silicon) or silicon-on-insulator (SOI). The highly doped layer 304 may be epitaxial grown (or formed in some other conventional manner) and doped with either n-type or p-type dopants, as desired. Any suitable thickness and doping concentrations may be utilized, as desired. In one embodiment, the n-type doping concentration may be in the range between about $5\times10^{19}/cm^3$ to $1\times10^{21}/cm^3$, the p-type doping concentration may be in the range between about $5\times10^{19}/cm^3$ to $1\times10^{21}/cm^3$, and the layer thickness may range on the order of about 5 nanometers (nm) to 30 nm. As will be appreciated, at least a portion of this layer 304 will eventually form the S/D regions 104, 204 for the devices 10, 20 (as shown in FIG. 1).

The first lightly doped layer 306 may be epitaxial grown (or formed in some other conventional manner) and doped with either n-type or p-type dopants, as desired. The doping typically matches with the dopant type of the highly doped layer 304. Any suitable thickness and doping concentrations can be utilized, as desired. In one embodiment, the doping concentration may be in the range between about $1\times10^{18}/cm^3$ to $5\times10^{19}/cm^3$ for n-type, and may be in the range between about $1\times10^{18}/cm^3$ to $5\times10^{19}/cm^3$ for p-type, and the layer thickness may range on the order of about 2 nm to 15 nm. As will be appreciated, this layer will eventually form the lightly doped extension region 104a, 204a for the S/D regions 104, 204, respectively, for the devices 10, 20 (as shown in FIG. 1).

The second lightly doped layer 310 may be epitaxial grown (or formed in some other conventional manner) and doped with either n-type or p-type dopants, as desired. The doping typically matches with the dopant type of the other yet-to-be-formed S/D regions 102, 202. Any suitable thickness and doping concentrations can be utilized, as desired. In one embodiment, the doping concentration may be in the range of between about $1\times10^{18}/cm^3$ to $5\times10^{19}/cm^3$ for n-type, and may be in the range from between about $1\times10^{18}/cm^3$ to $5\times10^{19}/cm^3$ for p-type, and the layer thickness may range between about 2 nm to 15 nm. This layer will eventually form the lightly doped extension region 102a, 202a for the S/D regions 102, 202, respectively, for the devices 10, 20 (as shown in FIG. 1).

The channel region layer 308 may be epitaxial grown (or formed in some other conventional manner) and is either undoped or doped with n-type or p-type dopants that are opposite the conductivity type of the corresponding source and drain regions. The thickness will depend on desired channel length and other device parameters. When doped, the doping concentration may be in the range between about $5\times10^{15}/cm^3$ to $1\times10^{19}/cm^3$ for n-type, while the doping concentration may be in the range from about $5\times10^{15}/cm^3$ to $1\times10^{19}/cm^3$ for p-type. In one specific embodiment, the channel region layer is formed from intrinsic silicon, with a thickness in the range between about 6 nm to 50 nm. As will be appreciated, this layer will eventually form the fin structure or channel regions 106a, 206a for the devices 10, 20 (as shown in FIG. 1).

Once the semiconductor stack is provided (or formed), a FIN hard mask 330 is formed above the second lightly doped layer 310. A FIN pattern mask 340 is formed above the hard mask layer 330 for eventual etching/formation of the fin channel structures 106, 206. Any suitable mask material may be used, and for example, the FIN hard mask material may be nitride, oxide/nitride stack, or a stack of other insulator material(s), while the FIN pattern mask material may be photoresist material (or some other suitable material).

Figure 3:
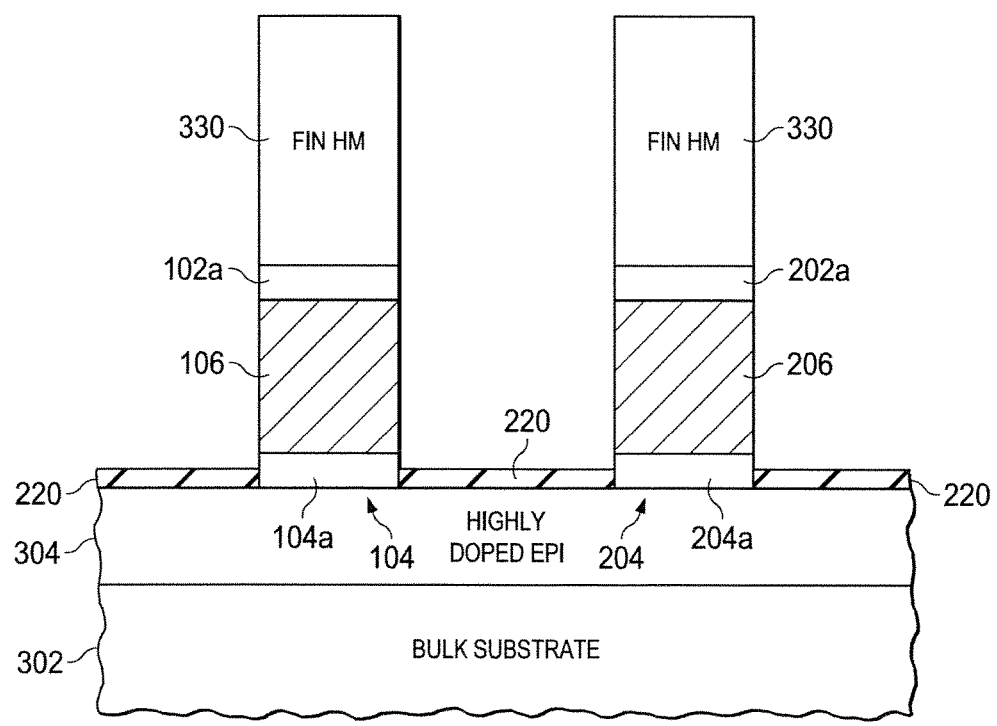

Now turning to FIG. 3, the structure shown in FIG. 2 undergoes an etch process which selectively removes portions of the FIN hard mask 330, the second layer 310, the channel region layer 308 and the first layer 306. The etching process stops at the highly doped layer 304. Thereafter, the PB pattern mask 340 is removed and the remaining FIN hard mask 330 provides a pattern mask. The bottom isolation layer 220 is formed (illustrated in FIG. 3) and functions to isolate the layer 304 from the eventual gate stack 208 that will be formed thereabove. In one embodiment, the isolation layer 220 is oxide (other suitable insulator material(s) may be utilized).

Figure 4:
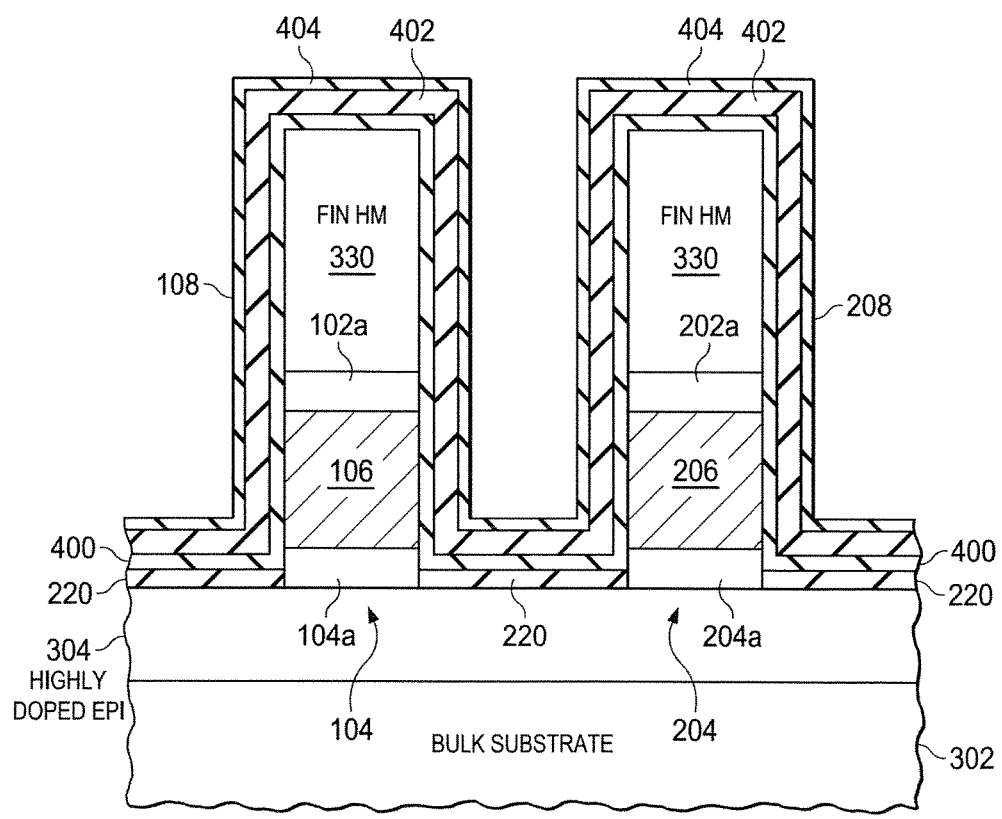

With reference to FIG. 4, the gate stack 108/208 is formed over the structure, and in particular, is formed on the sidewalls of the channel regions 106, 206 and on the bottom isolation layer 220. The gate stack 108/208 is formed of a high-K dielectric material layer 400, a work function metal layer 402 and a nitride layer 404. As will be appreciated, these three layers will eventually form the gate insulator regions 110/210, the work function conductive layer (WFM) regions 112/212, and the nitride layer regions 114/214 (as shown in FIG. 1).

Any suitable gate insulator layer may be utilized. In one embodiment, the gate insulator layer 400 is formed of hafnium oxide ($HfO_2$) or other high-K material. Any suitable work function conductive material may be utilized as the WFM layer 402—depending on the desired work function (eV). Such WFMs may include titanium nitride (TiN), titanium carbide (TiC) and the like. Optionally (and not shown in the FIGURES), in addition to the WFM layer 402, an additional conductive layer may be formed above and in contact with the WFM layer 402, such as a thin tungsten layer (or other material suitable for use as a gate contact layer). Next, the nitride layer 404 is formed using suitable nitride material(s), such as silicon nitride.

Figure 5:
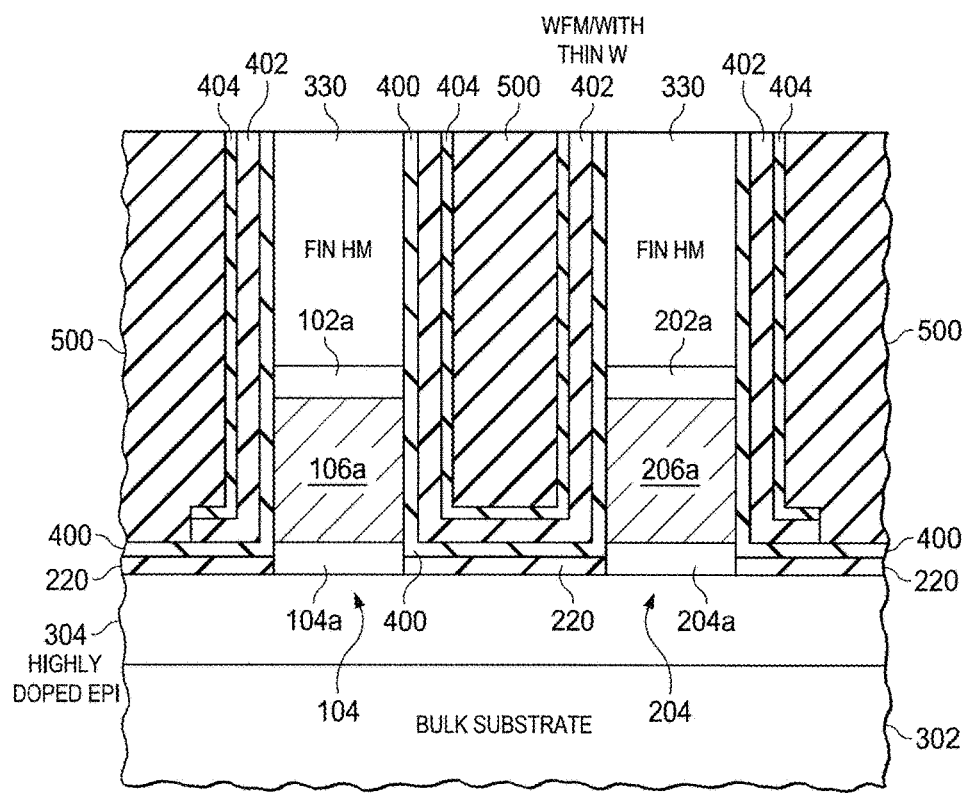

Now turning to FIG. 5, after formation of the gate stack 108/208 (i.e., layers 400, 402 and 404), the valleys or voids are filled with insulative material 500, such as silicon oxide, by any suitable process (e.g., spin-on, deposition, etc.). Chemical-mechanical polishing (CMP) is performed to planarize the structure—wherein the FIN hard mask 330 is utilized as an etch stop.

Figure 6:
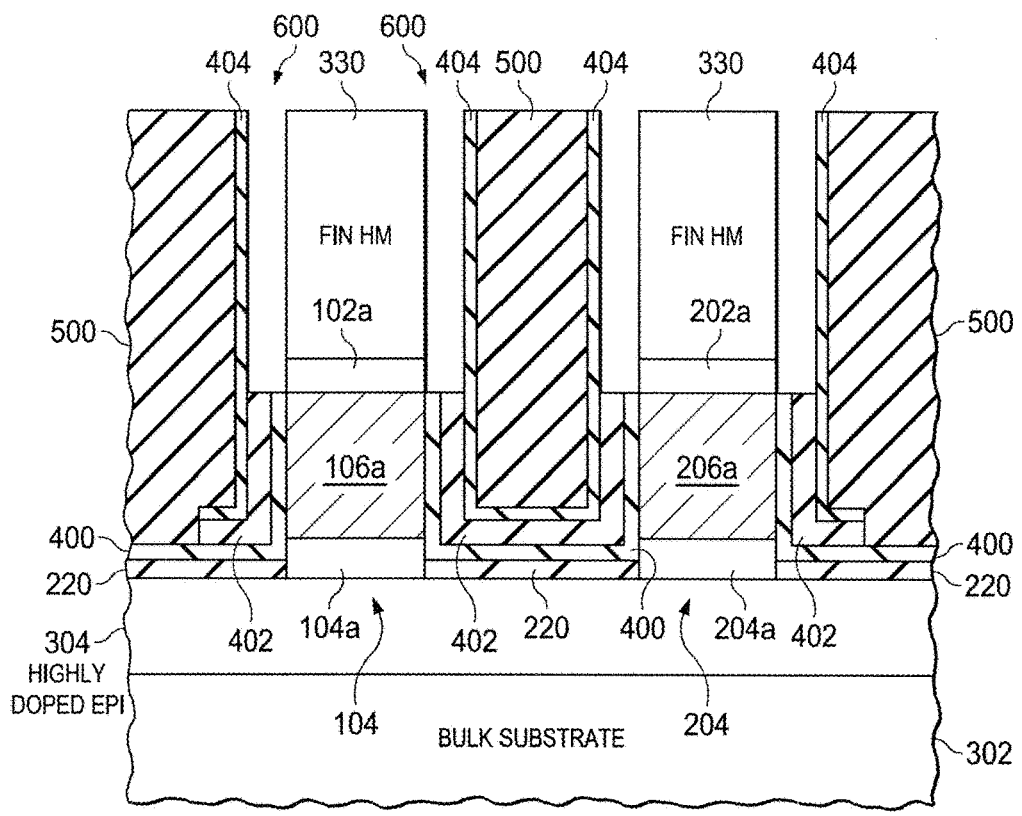

Now turning to FIG. 6, a selective etch removes portions of the high-K gate insulator layer 400 and portions of the WFM layer 402 which are exposed. This etching is vertical in nature and selectively removes these two layers between the FIN hard mask 330 and the nitride layer 404 in a vertical direction. The etching is timed and removes material down to a point near, or at, the top of the channel region layer 308 (the top of channel regions 106, 206) which forms recesses 600—as illustrated in FIG. 6.

Figure 7:
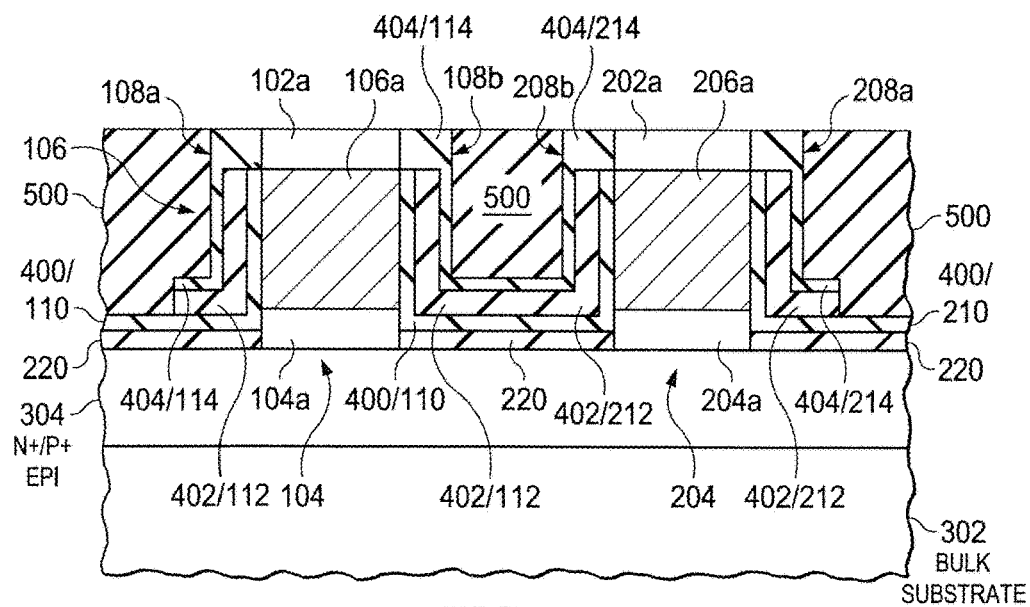

With reference to FIG. 7, a planarization process (e.g., CMP) removes the materials (FIN hard mask, oxide, SiN) present above the second lightly doped layer 306—as illustrated. This planarization process may include forming additional silicon nitride or oxide material within any remaining voids or recesses to achieve suitable planarization.

Figure 8:
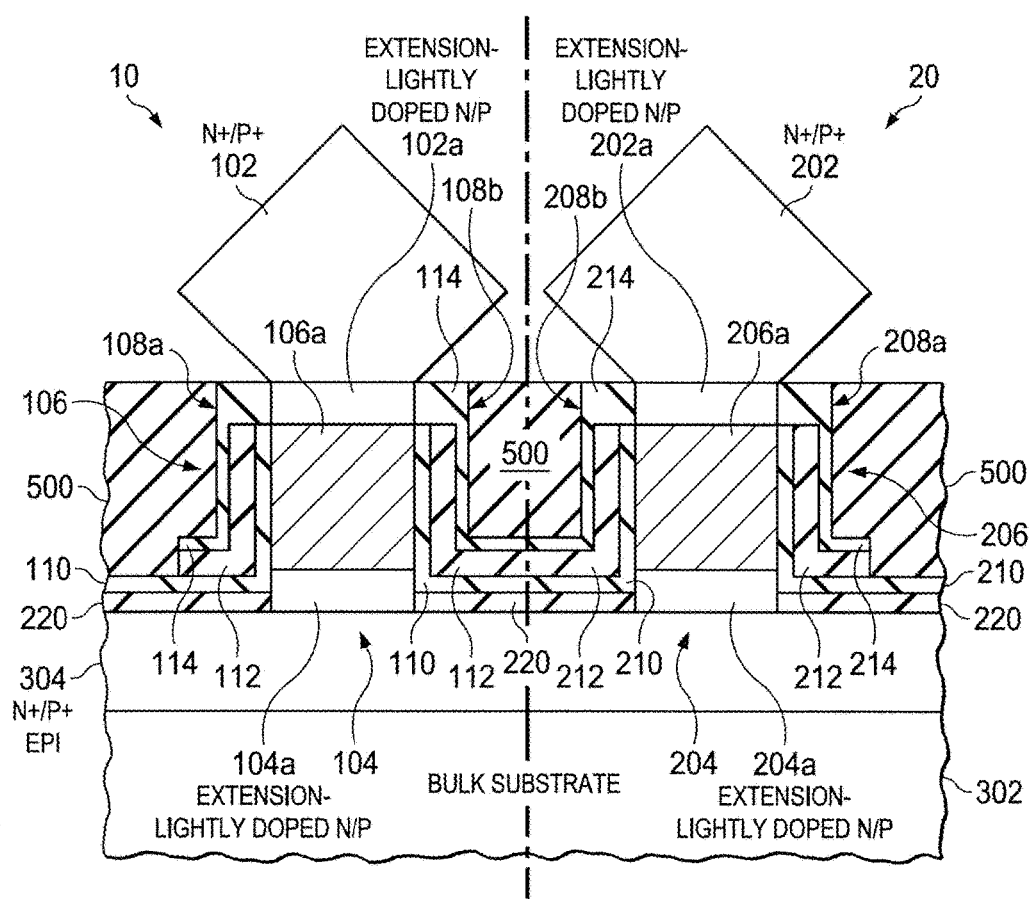

Now turning to FIG. 8, the S/D regions 104, 204 are formed above, and in contact with, the lightly doped extension regions 104a, 204b, respectively. This may be implemented by epitaxial growing a highly doped layer similar to the method of formation of the opposite S/D regions 102, 202—by forming a layer similar to the highly doped layer 304. Other methods of forming these S/D regions 102, 202 may be utilized. In one embodiment, the cross-sectional shape may be in the form of a diamond, but could be square, rectangle or other shape depending on the desired method of forming the epitaxial layer.

The S/D regions 102, 202 may be epitaxial grown (or formed in some other conventional manner) and doped with either n-type or p-type dopants, as desired, and consistent with the doping type of their corresponding respective S/D regions 104, 204 (the S/D regions at a lower elevation). Any suitable thickness and doping concentrations may be utilized, as desired. In one embodiment, the n-type doping concentration may be in the range from about $5\times10^{19}/cm^3$ to $1\times10^{21}/cm^3$, the p-type doping concentration may be in the range from about $5\times10^{19}/cm^3$ to $1\times10^{21}/cm^3$, and the layer thickness may be in the range of between about 5 nm to 30 nm.

Though not shown, a gate electrode may be electrically connected to the gate stack 108/208 and formed of any suitable conductive material, such as amorphous silicon, polysilicon, metal or metal alloys.

While FIG. 2-8 show relevant steps in one embodiment of forming the devices 10, 20, additional conventional/typical semiconductor manufacturing processes generally follow (which are not described herein, and is unnecessary for the understanding of the teachings herein).

Figure 9:
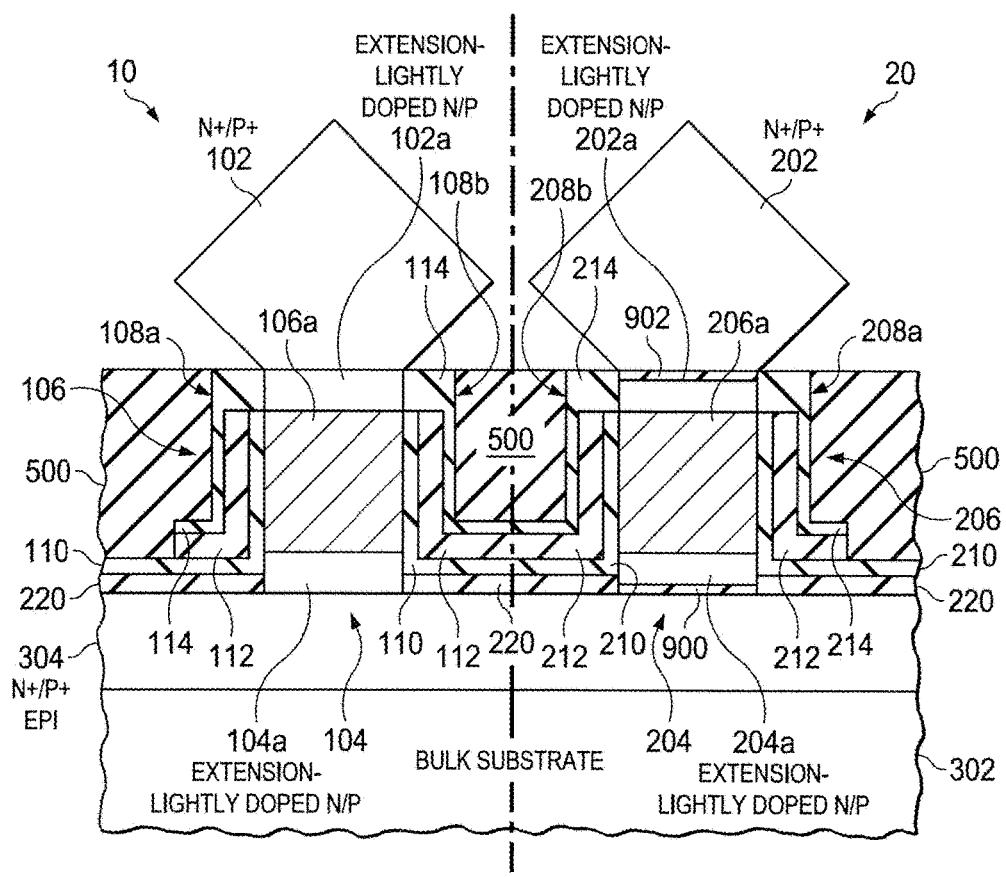
FIG. 9 illustrates a cross-sectional view of another embodiment of FinFET-type devices similar to those shown in FIG. 1.

FIG. 9 is similar to FIG. 1, and illustrates a different embodiment for the device 20 (identified with reference numeral 20a). In this embodiment, the S/D regions of the device 20a include p-type/n-type dopants, such as boron/ phosphorous. When the device is a p-channel or n-channel device, a first diffusion barrier layer 900 may be added and disposed between the lightly doped extension region 204a and the S/D region 204, and a second diffusion layer 902 is disposed between the lightly doped extension region 202a and the S/D region 202. In one embodiment, these diffusion layers are formed of silicon carbide or other suitable materials to prevent or reduce diffusion of the p-type or n-type dopants from the highly doped S/D regions 204, 202 into the lightly doped extension regions 204a, 202a.

It will be understood that well known processes have not been described in detail and have been omitted for brevity. Although specific steps, structures and materials may have been described, the present disclosure may not limited to these specifics, and others may substituted as is well understood by those skilled in the art, and various steps may not necessarily be performed in the sequences shown.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of fabricating a vertically-oriented Fin field-effect transistor (FinFET) device, the method comprising:
   providing a semiconductor substrate stack, comprising,
      a bulk substrate,
      a lower source/drain (S/D) layer disposed above the bulk substrate and comprising a first concentration of dopants of a first conductivity type,
      a lower extension layer disposed above the lower S/D layer and comprising a second concentration of dopants of the first conductivity type,
      a channel region layer comprising semiconductor material, and
      an upper extension layer disposed above the channel region layer and comprising a third concentration of dopants of the first conductivity type;
   forming a hard mask layer above the semiconductor substrate stack and exposing portions thereof;
   selectively removing exposed portions to define a fin channel structure comprising at least portions of the upper extension layer, the channel region layer, and the lower extension layer, and to expose sidewalls of the channel region layer;
   forming a gate stack on the exposed sidewalls of the channel region layer;
   performing a planarizing and etching process to expose at least a portion of the upper extension layer; and
   forming an upper S/D layer on the exposed upper extension layer and comprising a fourth concentration of dopants of the first conductivity type.

2. The method in accordance with claim 1 wherein forming the gate stack comprises:
   forming a gate insulator layer having a high-K;
   forming a work function metal (WFM) layer above the gate insulator layer; and
   forming a nitride layer above the WFM layer.

3. The method in accordance with claim 2 wherein the gate dielectric comprise hafnium oxide.

4. The method in accordance with claim 3 wherein the WFM layer comprises:
   a first layer comprising titanium; and
   a second layer comprising tungsten.

5. The method in accordance with claim 1 wherein:
   the first concentration of dopants is greater than the second concentration of dopants; and
   the third concentration of dopants is less than the fourth concentration of dopants.

6. The method in accordance with claim 1 wherein the lower extension layer and the upper extension layer each have a thickness between about 2 to 15 nanometers.

7. The method in accordance with claim 1 further comprising:
   forming and disposing a first diffusion barrier layer between the upper extension layer and the upper S/D region.

8. The device in accordance with claim 7 wherein the first diffusion barrier layer comprises carbon.

9. A method of fabricating a semiconductor device structure, the method comprising:
   providing a semiconductor substrate stack, comprising,
      a lower source/drain (S/D) layer disposed above a bulk substrate and comprising dopants of a first conductivity type,
      a lower extension layer disposed above the lower S/D layer and comprising dopants of the first conductivity type,
      a channel region layer comprising semiconductor material, and
      an upper extension layer disposed above the channel region layer comprising dopants of the first conductivity type;
   forming a mask layer above the semiconductor substrate stack, exposing portions thereof, and selectively removing exposed portions to define a fin channel structure comprising at least portions of the upper extension layer, the channel region layer, and the lower extension layer, and to expose sidewalls of the channel region layer;
   forming a gate on the exposed sidewalls of the channel region layer;
   planarizing and etching to expose at least a portion of the upper extension layer; and
   forming an upper S/D layer on the exposed upper extension layer, the upper S/D layer comprising dopants of the first conductivity type.

10. The method in accordance with claim 9 wherein forming the gate comprises:
    forming a gate insulator layer having a high-K;
    forming a work function metal (WFM) layer above the gate insulator layer, the WFM layer comprising,
       a first layer comprising titanium, and
       a second layer comprising tungsten; and
    forming a nitride layer above the WFM layer.

11. The method in accordance with claim 10 wherein the upper S/D layer has a first concentration of dopants of the first conductivity type, the upper extension has a second concentration of dopants of the first conductivity type, and the first concentration is greater than the second concentration.

* * * * *